United States Patent [19]
Vokey et al.

[11] Patent Number: 5,990,686
[45] Date of Patent: Nov. 23, 1999

[54] METHOD AND APPARATUS FOR LOCATING RESISTIVE FAULTS IN COMMUNICATION AND POWER CABLES

[76] Inventors: David E. Vokey, 1206 Northwind Cir., Bellingham, Wash. 98226; Kenneth N. Sontag, Box 21, Group 529, R.R. 5, Winnipeg Manitoba, Canada, R2C 2Z2; Gilles Aminot, Box 636, Ile Des Chenes, Manitoba, Canada, R0A 0T0

[21] Appl. No.: 08/666,628

[22] Filed: Jun. 18, 1996

[51] Int. Cl.$^6$ .................................................. G01R 31/08
[52] U.S. Cl. ........................ 324/523; 324/509; 324/522; 324/527
[58] Field of Search ...................................... 324/509, 522, 324/523, 527, 528, 529, 539, 540, 541, 543, 544; 379/22, 25, 26; 361/42, 46, 78, 79, 82

[56] References Cited

U.S. PATENT DOCUMENTS

| | | | |
|---|---|---|---|
| 4,227,146 | 10/1980 | Hodge | 324/509 X |
| 4,559,491 | 12/1985 | Saha | 324/522 |
| 4,728,898 | 3/1988 | Staley et al. | 324/522 |
| 4,795,983 | 1/1989 | Crocket et al. | 324/522 X |
| 4,947,469 | 8/1990 | Vokey et al. | 324/523 |
| 5,399,974 | 3/1995 | Eriksson et al. | 324/521 |

*Primary Examiner*—Vinh P. Nguyen
*Assistant Examiner*—Diep Do
*Attorney, Agent, or Firm*—Murray E. Thrift; Adrian D. Battison

[57] ABSTRACT

A resistive fault location method and apparatus are used on communication and power cables. Two instruments are connected to opposite ends of the faulted conductor. Each takes a series of voltage and current measurements that are then processed to determine the distance from each end of the conductor to the fault. To eliminate voltage and current transients, the data collected is statistically analyzed and data that is analyzed as being affected by transients is discarded. The remaining data is taken as being steady state data. This eliminates any requirement for simultaneous measurements at opposite ends of the conductor and accounts for any situation where local transients at the two ends of the conductor are different at any given instant.

8 Claims, 9 Drawing Sheets

METHOD AND APPARATUS FOR LOCATING RESISTIVE FAULTS IN COMMUNICATION AND POWER CABLES

FIELD OF THE INVENTION

The present invention relates to the location of resistive faults in communication and power cables.

BACKGROUND

Communication and power cables, which operate exposed to the environment, often develop faults between the insulated conductors or between the metallic shields or armor and earth. Locating and repairing damage to communication and power cables presents a particular challenge when certain types of fault develop. A conductor to conductor or conductor to ground fault caused by moisture is particularly difficult to locate. This type of fault tends to be erratic, with the ohmic value of the fault resistance changing with applied voltage and polarity over time. The unpredictable and electrically noisy nature of such faults makes fault locating using simple loop measurements from the ends of the faulted conductor(s) ineffective.

A measurement method and device to address this problem is described by Vokey et al U.S. Pat. No. 4,947,469. The patent details a method whereby instruments are placed at both ends of the faulted conductor(s). A series of simultaneous measurements are then carried out by carefully synchronizing the instruments such that the voltage and current readings are recorded at both ends at the same instant. The instrument at the remote end transmits its measurement data to the first instrument for computation. The conductor resistances are then calculated as follows:

$$R_a = \frac{1}{N}\sum_{i=1}^{N} (V_{ai} - V_{bi})/I_{ai} \quad (1)$$

$$R_b = \frac{1}{N}\sum_{i=1}^{N} (V_{bi} - V_{ai})/I_{bi} \quad (2)$$

Where: $V_a$ is the voltage at end a, $I_a$ is the current at end a;
$V_b$ is the voltage at end b, $I_b$ is the current at end b;
i is the ith simultaneous measurement; and
N is the number of simultaneous measurements.

A fundamental limitation exists in this method. The simultaneous measurement of the voltage and current at the conductor ends assumes that steady state conditions will predictably exist at both ends at the same instant.

In practical applications such as locating damage to the plastic and steel protective outer jacket on buried fiber optic communication cables, the conductor ends can be 100 km or more apart. At these distances the series resistance and parallel capacitance to ground of the protective steel armor gives rise to transmission line phase delays. Disturbances along the conductor from external electrical influences such as power lines or telluric earth currents affect the ends of the conductors differently at different times. These disturbances coupled with time delays result in different transient voltage and current conditions at different times at the conductor ends. These transient voltages can introduce measurement errors at the precise time of the simultaneous measurements.

The present invention is concerned with a determination of the distance to a conductor fault without the inherent susceptibility to errors caused by transient voltages and other electrical disturbances.

SUMMARY

According to one aspect of the present invention there is provided a method of locating a resistive fault between first and second ends of an electric conductor, said method comprising:

(a) applying a DC voltage to the first end of the conductor;

(b) taking a series of first voltage readings of the DC voltage at the first end of the conductor;

(c) taking a series of first current readings at the first end of the conductor;

(d) taking a series of second voltage readings of the DC voltage at the second end of the conductor;

(e) recording the first voltage, first current and second voltage readings;

(f) analyzing the readings and discarding readings analyzed to have been effected by transients;

(g) computing from the undiscarded readings average values for the first voltage, first current and second voltage readings;

(h) computing from the average values for the first voltage, first current and second voltage readings the resistance of the conductor between the resistive fault and the first end of the conductor; and (i) computing the distance between the resistive fault and the first end of the conductor from the computed resistance of the conductor.

The invention thus calculates the distance to a resistive fault from a series of measurements which are made independently at both ends of the faulted conductor. During a measurement cycle, the instruments connected to the conductor ends take a series of voltage and current readings. At the end of the cycle the data is examined for transient conditions. The transient data is statistically eliminated ensuring that steady state readings only are used for the calculation, thereby eliminating errors from electrical disturbances. The average of the remaining data is then calculated and saved.

No attempt is made to synchronize the measurements. The instruments make independent and therefore uncorrelated measurements during the test cycle. Another significant advantage exists in that the time to establish the synchronized communication and measurement routine is eliminated. The remote unit preferably processes the data independently, so that the remote unit only needs to transmit the computed average values back to the controlling end rather than every single data point. This greatly speeds up the measurement routine and produces more accurate results in a fraction of the time.

In preferred embodiments of the invention, the process is repeated applying positive and negative DC voltages to the conductor and the complete measurement cycle is completed from the second end of the conductor.

According to another aspect of the present invention there is provided an apparatus for locating a resistive fault between first and second ends of an electric conductor, said apparatus comprising:

a first power supply for applying a DC voltage to the first end of the conductor;

first voltage metering means for taking a series of first voltage readings of the DC voltage at the first end of the conductor;

first current metering means for taking a series of first current readings at the first end of the conductor;

second voltage metering means for taking a series of second voltage readings of the DC voltage at the second end of the conductor;

recording means for recording the first voltage, first current and second voltage readings;

means for analyzing the readings and discarding readings analyzed to have been effected by transients;

means for computing from the undiscarded readings average values for the first voltage, first current and second voltage readings;

means for computing from the average values for the first voltage, first current and second voltage readings the resistance of the conductor between the resistive fault and at least one end of the conductor; and means for computing the distance between the resistive fault and at least one end of the conductor from the computed resistance of the conductor.

The apparatus is preferably two similar control units connected to opposite ends of the faulted conductor. Each unit has a computing capability to analyze the readings taken and to compute average values to be communicated between the units.

BRIEF DESCRIPTION OF THE DRAWINGS

In the accompanying drawings, which illustrate an exemplary embodiment of the present invention.

DETAILED DESCRIPTION

Figure 1:
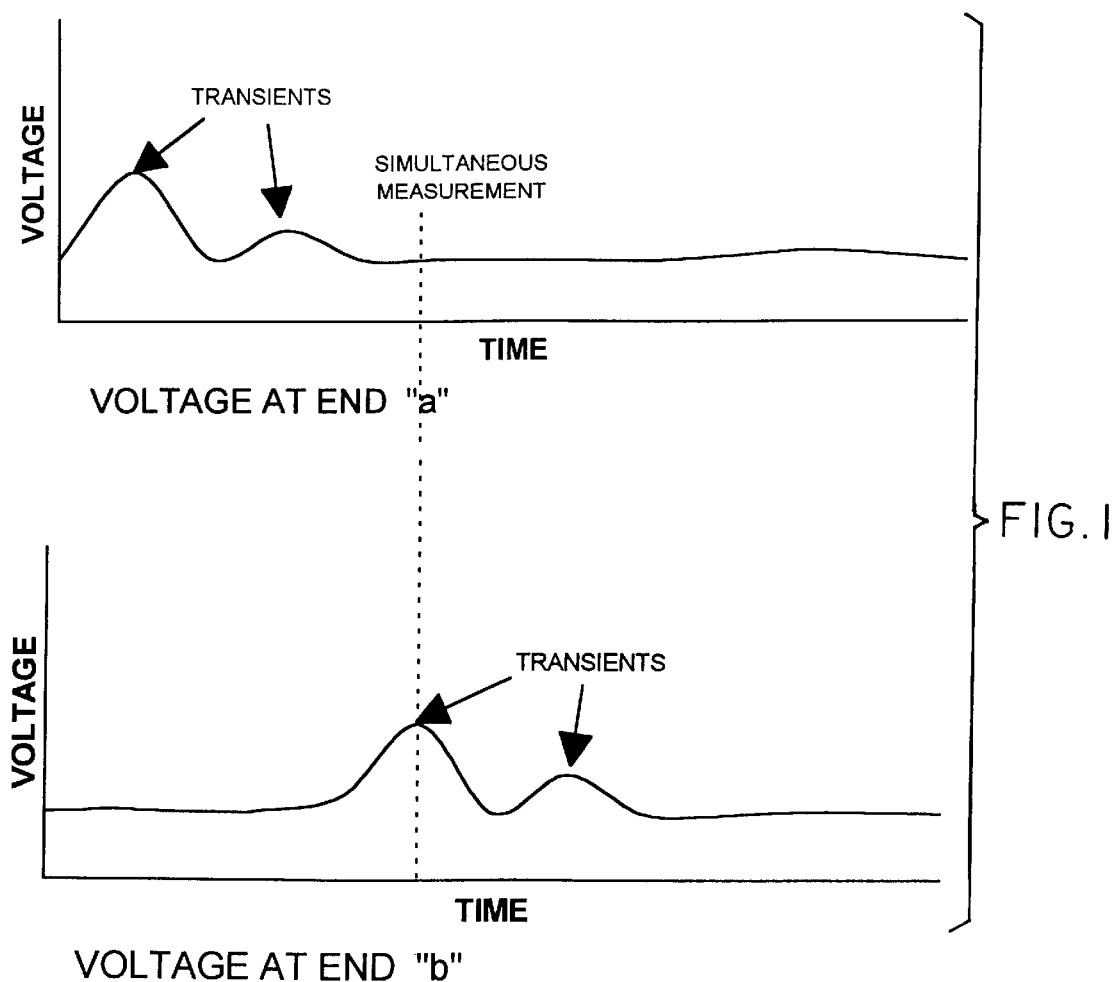
FIG. 1 is a chart showing the transient voltage conditions at the end of a long conductor.

In practical applications of the present invention, such as locating damage to the plastic and steel protective outer jacket on buried fibre optic communication cables, the conductor ends can be 100 km or more apart. At these distances, the series resistance and parallel capacitance to ground of the protective steel armor gives rise to transmission line phase delays. Disturbances along the conductor from external electrical influences such as power lines or telluric earth currents affect the ends of the conductors differently at different times. These disturbances, coupled with time delays result in different transient voltage and current conditions at different times at the conductor ends. This is shown graphically in FIG. 1. As shown in that figure a simultaneous measurement of voltage at opposite ends of the conductor ends "a" and "b" can introduce measurement errors at the precise time of the simultaneous measurements.

Figure 2:
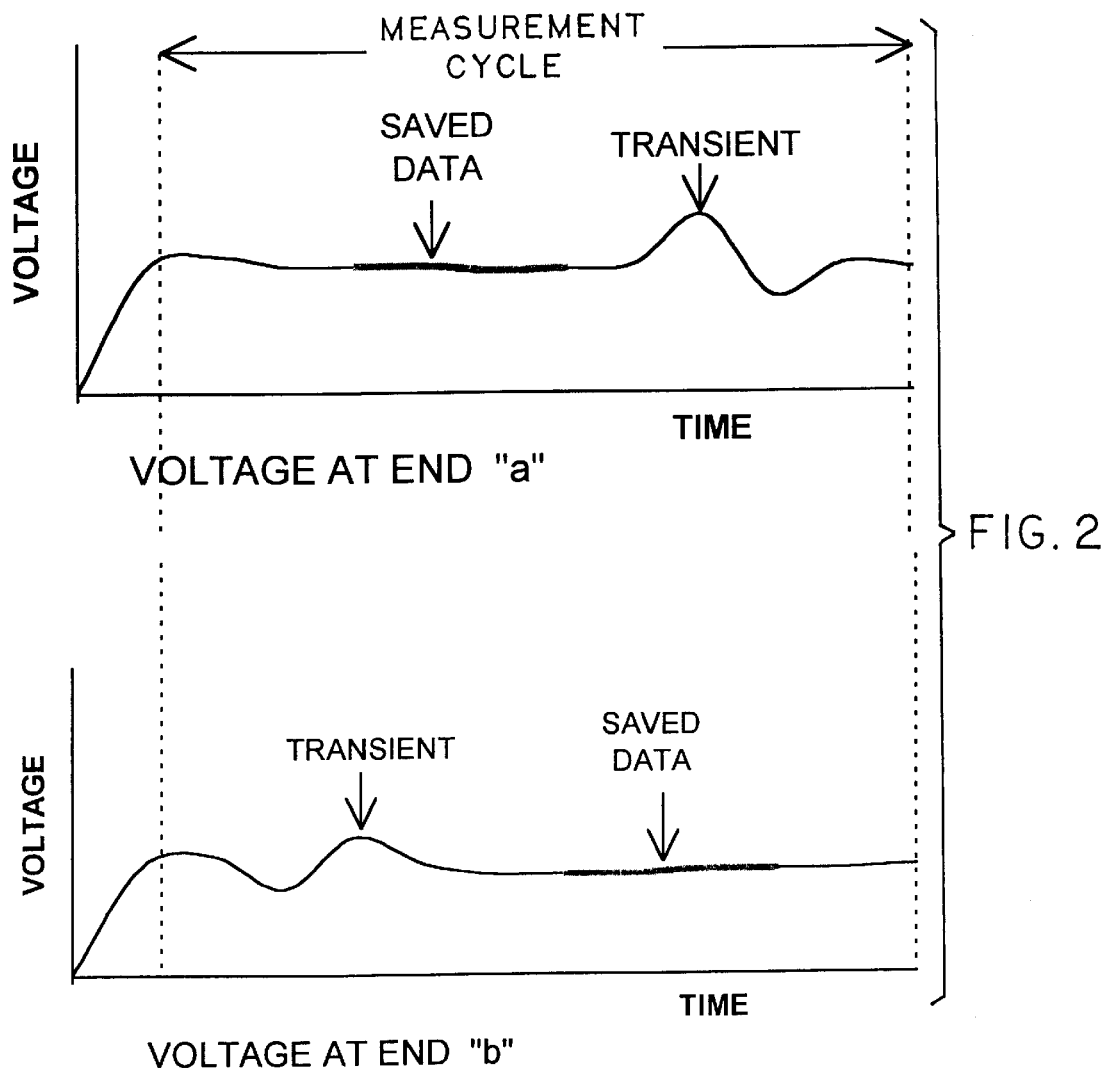
FIG. 2 is a chart like FIG. 1 showing a typical test cycle.

As shown in FIG. 2, with the present invention there is no attempt made to synchronize the measurements. The independent and therefore uncorrelated measurements are made at opposite ends of the conductor during a measurement cycle. The data produced is analyzed and data analyzed as being affected by transients is discarded. The remaining, saved data is representative of steady state conditions.

Figure 3:
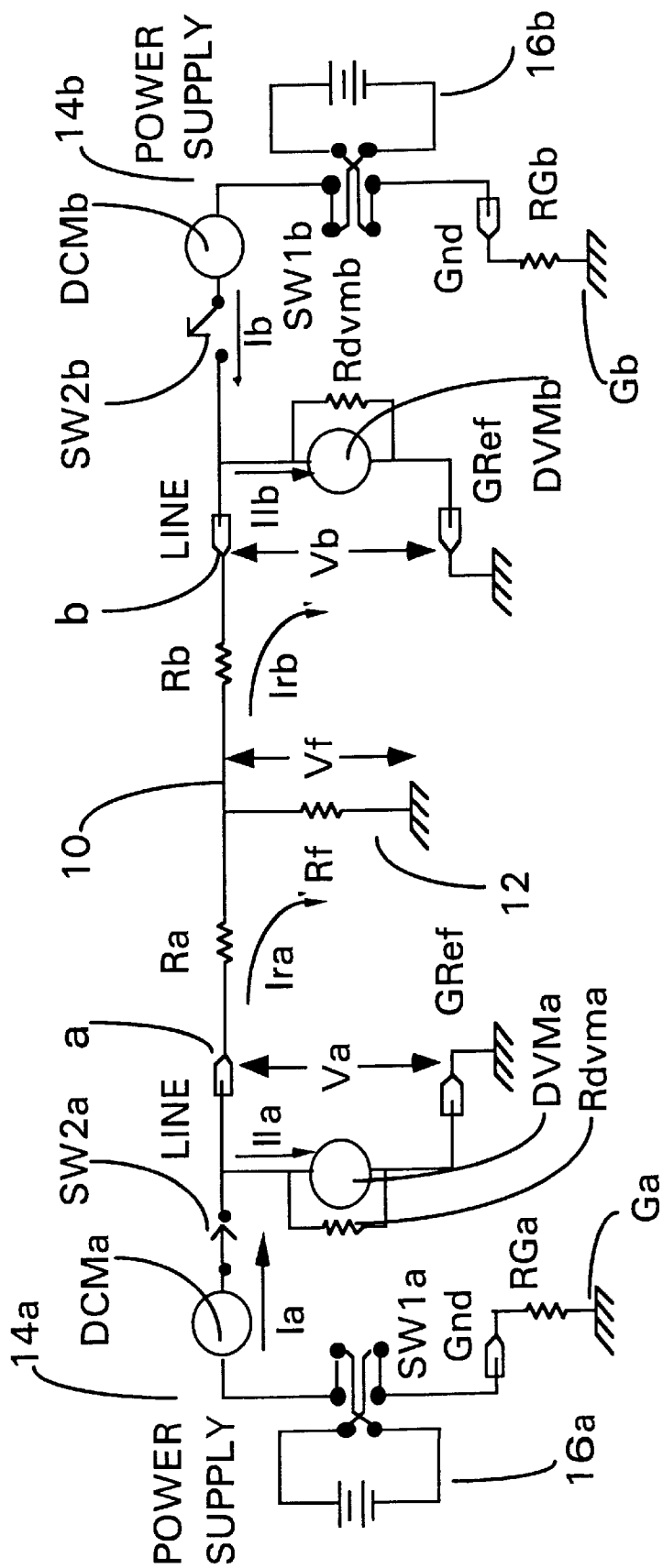
FIG. 3 is a schematic view of the measurement circuit according to the present invention.

The measurement circuit for determining the location of a resistive fault is illustrated schematically in FIG. 3 connected to a conductor 10 faulted to ground by resistive fault 12. The ends of the conductor are designated "a" and "b". In the following, those letters will be used to designate characteristics of the measurement circuit located at those respective ends.

The measurement circuit includes two instruments 14a and 14b connected to the ends "a" and "b" respectively of the conductor. The instruments include respective power supplies 16a and 16b connected to respective polarity reversing switches SW1a and SW1b. The switches are connected to ground points Ga and Gb which are located locally at the ends of the cable. The ground resistances of Ga and Gb are RGa and RGb respectively. Switches SW1a and SW1b are connected to respective digital current meters DCMa and DCMb which are in turn connected to the associated conductor ends through switches SW2a and SW2b.

Two digital voltmeters DVMa and DVMb are connected to the respective conductor ends and respective reference grounds Gref. The reference grounds are placed outside the voltage gradients of the associated local grounds.

The measuring current is driven through the ground resistances RGa and RGb. These resistances are generally unknown and may cause significant error. The placement of the reference grounds Gref outside the local ground voltage gradients minimizes the voltage drop error of the local ground resistance.

The voltmeters DVMa and DVMb have respective meter resistances RDVMa and RDVMb. As shown in FIG. 3, the resistance of the conductor from end "a" to the resistive fault is designated Ra. The resistance of the conductor from end "b" to the resistive fault 12 is designated Rb. The resistance of the fault itself is designated Rf.

The location of the ground fault 12 is carried out as follows:

1. Switch SW2b is open to disconnect power supply 16b. Switch SW2a is closed to connect the power supply 16a to the conductor 10. The power supply switch SW1a is set to make the conductor positive with respect to ground.

2. The voltmeters DVMa and DVMb and current meter DCMa independently take a series of reading over a measurement cycle.

3. At the end of the measurement cycle, the test voltage is removed and the instruments independently analyze the readings. Those readings analyzed as affected by transient conditions are discarded and the remaining readings are averaged. The technique used for identifying readings as affected by transient conditions involve calculating the mean of the readings:

$$\overline{X} = \sum_{i=1}^{n} \frac{X_i}{n}$$

where $X_i$ is a specific measurement n is the total number of measurements and $\overline{X}$ is the mean. A standard deviation is then computed:

$$\delta = \sqrt{\frac{1}{n-1} \sum_{i=1}^{n} (X_i = \overline{X})^2}$$

where $\delta$ is the standard deviation.

The measurements $X_i$ that are within the bounds $\overline{X} \pm \delta$ will be kept for subsequent calculations. Any measurement outside these bounds will be rejected since they were probably affected by transient conditions. More specifically:

If $|X_i| \leq |\overline{X} \pm \delta|$ then the reading $X_i$ will be accepted.

If $|X_i| > |\overline{X} \pm \delta|$ then the reading $x_i$ will be rejected.

4. At end "a" the instrument 14a retains N reading $V_{ai+}$ and $I_{ai+}$. Instrument 14b retains M readings of $V_{1bi+}$.

5. The power supply switch SW1*a* is thrown to make the conductor negative with respect to ground and steps 2, 3 and 4 are repeated. Instrument 14*a* retains N readings of $V_{ai-}$ and $I_{ai-}$. Instrument 14*b* retains M readings of $V_{1bi-}$.

6. The instruments compute the averages of the recorded readings.

Instrument 14*a* calculates:

$$Va+ = \frac{1}{N}\sum_{i=1}^{N} Vai+; \quad Ira+ = \frac{1}{N}\sum_{i=1}^{N} Iai+ - \frac{Vai+}{R_{DVMa}};$$

$$Va- = \frac{1}{N}\sum_{i=1}^{N} Vai-; \quad Ira- = \frac{1}{N}\sum_{i=1}^{N} Iai- - \frac{Vai-}{R_{DVMa}};$$

where Va is the voltage to ground at conductor end "a" and Ira is the current in conductor 10 from end "a" to the location of fault 12.

Instrument 14*b* calculates:

$$V1b+ = \frac{1}{M}\sum_{i=1}^{M} V1bi+; \quad I1b+ = \frac{1}{M}\sum_{i=1}^{M} \frac{V1bi+}{R_{DVMb}};$$

$$V1b- = \frac{1}{M}\sum_{i=1}^{M} V1bi-; \quad I1b- = \frac{1}{M}\sum_{i=1}^{M} \frac{V1bi-}{R_{DVMb}};$$

where V1*b* is the voltage to ground at end "b" of the conductor 10 and I1b is the leakage current through volt meter DVMb.

The conductor resistance Ra from the end "a" to the ground fault and the conductor voltage to ground at the ground fault R approximated using the following formulas:

$$Ra_{approx} \cong \frac{\left[\frac{Va+ - Va-}{2}\right] - Vf1_{approx}}{\left[\frac{Ira+ - Ira-}{2}\right]}$$

$$Vf1_{approx} = \frac{V1b+ - V1b-}{2}$$

Where:
V1bi≈Vf1i; V1bi=Voltage Measurements at "b"

$$I1bi = \frac{V1bi}{R_{DVMb}};$$

I1bi=Current leakage through the DVM (if $R_{DVM}$=then I1b=0)

$R_{DVMb}$=Known Impedance at DVMb (Ideal DVM resistance= ), $$Irai = Iai - I1ai - \frac{Vai}{R_{DMVa}};$$

Iai=Current measurement at "a"
Vai=Voltage measurement at "a"
$R_{DVMa}$=Known Impedance at DVMa (Ideal DVM resistance=

7. Switch SW2*a* is opened to disconnect the power supply 16*a*. Switch SW2*b* is closed to connected power supply 16*b*. The power supply switch SW1*b* is set to make the conductor positive with respect to ground.

8. The voltmeters DVMa and DVMb and current meter DCMb independently take a series of readings over a measurement cycle.

9. At the end of the measurement cycle the test voltage is removed and the instruments independently analyze the readings taken. Those readings analyzed as affected by transient conditions are discarded and remaining readings are averaged.

10. At end "b" the instrument 14*b* retains N readings $Vb_{i+}$ and $Ib_{i+}$. Instrument 14*a* retains M readings of $V_{1ai+}$.

11. The power supply switch SW1*b* is thrown to make the conductor negative with respect to ground and steps 8 and 9 are repeated. Instrument 14*b* retains N readings of $V_{bi-}$ and $I_{bi-}$. Instrument 14*a* retains M readings of $V_{1ai-}$.

12. The instruments compute the averages of the recorded readings.

Instrument 14*b* calculates:

$$Vb+ = \frac{1}{N}\sum_{i=1}^{N} Vbi+; \quad Irb+ = \frac{1}{N}\sum_{i=1}^{N} Ibi+ - \frac{Vbi+}{R_{DVMb}};$$

$$Vb- = \frac{1}{N}\sum_{i=1}^{N} Vbi-; \quad Irb- = \frac{1}{N}\sum_{i=1}^{N} Ibi- - \frac{Vbi-}{R_{DVMb}};$$

where Vb is the voltage to ground at conductor end "b" and Irb is the current in conductor 10 from end "b" to the location of fault 12.

Instrument 14*a* calculates:

$$V1a+ = \frac{1}{M}\sum_{i=1}^{M} V1ai+; \quad I1a+ = \frac{1}{M}\sum_{i=1}^{M} \frac{V1ai+}{R_{DVMa}};$$

$$V1a- = \frac{1}{M}\sum_{i=1}^{M} V1ai-; \quad I1a- = \frac{1}{M}\sum_{i=1}^{M} \frac{V1ai-}{R_{DVMa}};$$

where V1*a* is the voltage to ground at end "a" of the conductor 10 and I1a is the leakage current through volt meter DVMa.

The conductor resistance Rb from the end "b" to the ground fault and the conductor voltage to ground at the ground fault are approximated using the following formulas:

$$Rb_{approx} \cong \frac{\left[\frac{Vb+ Vb-}{2}\right] - Vf2_{approx}}{\left[\frac{Irb+ - Irb-}{2}\right]}$$

$$Vf2_{approx} = \frac{V1a+ - V1a-}{2}$$

Where:
V1ai≈Vf2i; V1ai=Voltage Measurements at "a"

$$I1ai = \frac{V1ai}{R_{DVMa}};$$

I1ai=Current leakage through the DVM (if $R_{DVM}$=then I1a=0)

$R_{DVMa}$=Known Impedance at DVMa (Ideal DVM resistance= ), $$Irbi = Ibi - IIbi - \frac{Vbi}{R_{DMVb}};$$

Ibi=Current measurement at "b"
Vbi=Voltage measurement at "b"
$R_{DVMb}$=Known Impedance at DVMb (Ideal DVM resistance= )

13. Instrument 14*a*, which has calculated the approximate values for conductor resistances Ra and Rb, transmits the approximation of resistance Rb to instrument 14*b*. This allows the values to be refined by eliminating leakage currents.

14. The correct values of Ra, Rb and Rf, the fault resistance, are then calculated by eliminating the error produced by the voltage drops across the volt meters caused by the leakage currents through the volt meters.

15. The conductor resistance Ra and fault resistance Rf1 are calculated as follows:

$$Vf1i = V1bi + IIbi \times Rb_{approx} = V1bi + \frac{V1bi}{R_{DVMb}} \times Rb_{approx} = V1bi\left(1 + \frac{Rb_{approx}}{R_{DVMb}}\right)$$

$R_{DVMb}$=DVM impedance at "b"
V1bi=Voltage measurement at "b" when SW2*b* opened $$Irai = Iai - IIai = Iai - \frac{Vai}{R_{DVMa}};$$

Iai=Current measurements at "a" when SW2*a* closed
Vai=Voltage measurements at "a" when SW2*a* closed $$IIbi = \frac{V1bi}{R_{DVMB}};$$

$R_{DVMb}$=DVM impedance at "b"
V1bi=Voltage measurement at "b" when SW2*b* opened $$If1 = \frac{Ira+ - Ira-}{2} - \frac{IIb+ - IIb-}{2}$$

(Ira and IIb described above)

$$Vf1 = \frac{1}{M}\sum_{i=1}^{M} Vf1i = \left(1 + \frac{Rb_{approx}}{R_{DVMb}}\right)\frac{1}{M}\sum_{i=1}^{M} V1bi$$

$$IIb = \frac{1}{M}\sum_{i=1}^{M} IIbi$$

$$Ra = \frac{\left[\frac{Va+ - Va-}{2}\right] - \left[\frac{Vf1+ - Vf1-}{2}\right]}{\left[\frac{Ira+ - Ira-}{2}\right]}$$

$$Rf1 = \frac{\left[\frac{V_{f1+} - V_{f1-}}{2}\right]}{If1}$$

16. The conductor resistance Rb from end "b" to the fault and the fault resistance Rf2 are calculated as followed:

$$Vf2i = V1ai + IIai \times Ra_{approx} = V1ai + \frac{V1ai}{R_{DVMa}} \times Ra_{approx} = V1ai\left(\frac{Ra_{approx}}{R_{DVMa}}\right)$$

$R_{DVMa}$=Known DVM impedance at "a"
V1ai=Voltage measurements at "a" when SW2*a* opened $$Irbi = Ibi - IIbi = Ibi - \frac{Vbi}{R_{DVMb}};$$

Ibi=Current measurements at "b" when SW2*b* closed
Vbi=Voltage measurements at "b" when SW2*b* closed
$R_{DVMb}$=Known DVM impedance at "b"

$$IIai = \frac{V1ai}{R_{DVMa}};$$

$R_{DVMa}$=DVM impedance at "a"
V1ai=Voltage measurement at "b" when SW2*b* opened $$If2 = \frac{Irb+ - Irb-}{2} - \frac{IIa+ - IIa-}{2}$$

(Irb and IIa described above)

$$Vf2 = \frac{1}{M}\sum_{i=1}^{M} Vf2i = \left(1 + \frac{Ra_{approx}}{R_{DVMA}}\right)\frac{1}{M}\sum_{i=1}^{M} Vai$$

$$IIa = \frac{1}{M}\sum_{i=1}^{M} IIai$$

$$Rb = \frac{\left[\frac{Vb+ - Vb-}{2}\right] - \left[\frac{Vf2+ - Vf2-}{2}\right]}{\left[\frac{Irb+ - Irb-}{2}\right]}$$

$$Rf2 = \frac{\left[\frac{Vf2+ - Vf2-}{2}\right]}{[If2]}$$

Figure 4:
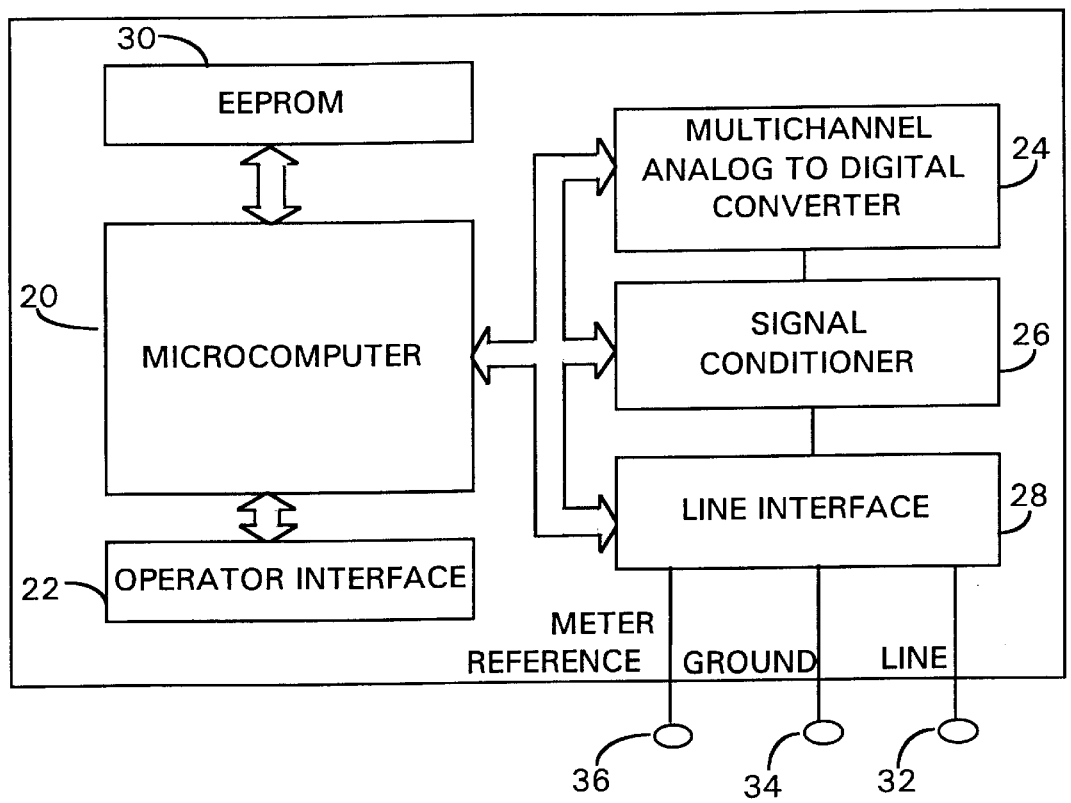
FIG. 4 is a schematic of a control unit.

Referring to FIG. 4, each of the instruments 14*a* and 14*b* consists of a microprocessor controlled with firmware instructions stored in EEPROM. The microprocessor 20 has an operator interface 22. It is connected to a multi-channel analog to digital converter 24, a signal additioner 26 and a line interface 28. The EEPROM 30 operates the test sequence and displays the data results. External connections are a conductor connection 32, a local ground connection 34 and the reference ground connection 36.

Figure 5:
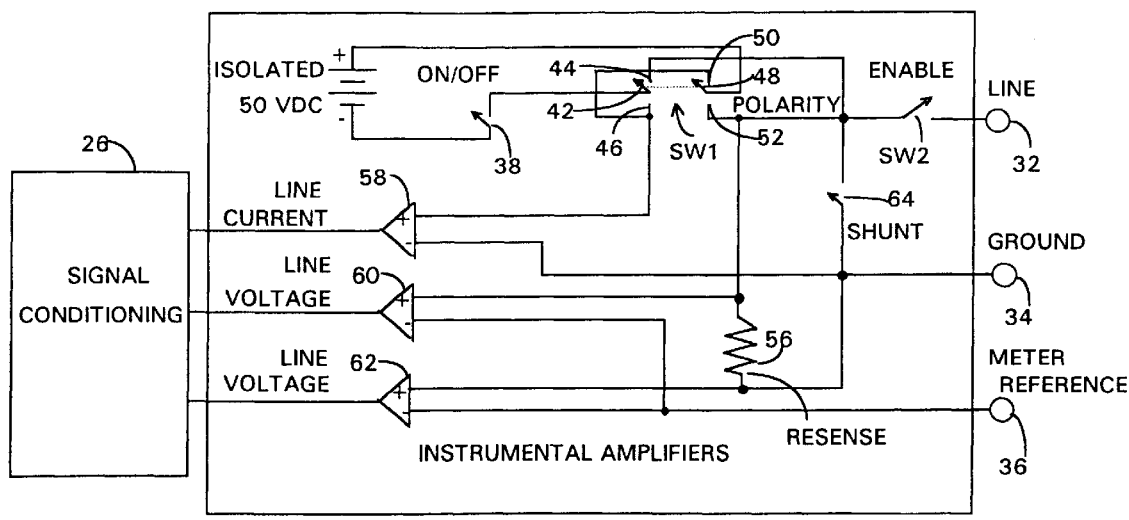
FIG. 5 is a schematic line interface included in the control unit.

FIG. 5 is a schematic representation of the line interface component of an instrument 14*a* or 14*b*. The line interface includes the power supply 16 which is connected through an on-off switch 38 to the polarity reversing switch SW1. The reversing switch is a double pull-double throw switch with one throw 42 connected to the negative terminal of the power supply through the on-off switch 38. The throw 42 connects with either terminal 44 or terminal 46. The other throw 48 is connected to the positive terminal of the power supply 16 and connects with either terminal 50 or 52 of the switch. The terminals 44 and 52 are connected through enable switch SW2 to the conductor connector 32 of the instrument. The terminals 46 and 52 are connected, through a resistor 56 to the ground terminal 34 of the unit. Thus, with the enable switch closed and terminals 51 and 55 engaged, the conductor terminal 32 is at a negative potential with respect to the ground terminal 34. With the switch terminals 44 and 52 engaged, the conductor terminal 32 is positive with respect to the ground terminal 34.

An amplifier 58 is connected in parallel across the resistor 56 and serves to provide a signal representing the current in the circuit between the conductor and ground terminals 32 and 34. A line voltage amplifier 60 is connected to the upstream side of the enable switch SW2 and to the reference ground terminal 36 to produce a signal representing the voltage between the conductor terminal 32 and the ground reference terminal 36. This equates to the voltage Va discussed above. A further amplifier 62 is connected between the ground terminal 34 and the ground reference terminal 36 and generates a signal representing the voltage between these two terminals. The outputs from the three amplifiers are passed to the signal conditioner 26 of the instrument 14.

A shunt switch 64 is connected across the conductor and ground terminals 32 and 34.

Figure 6A:
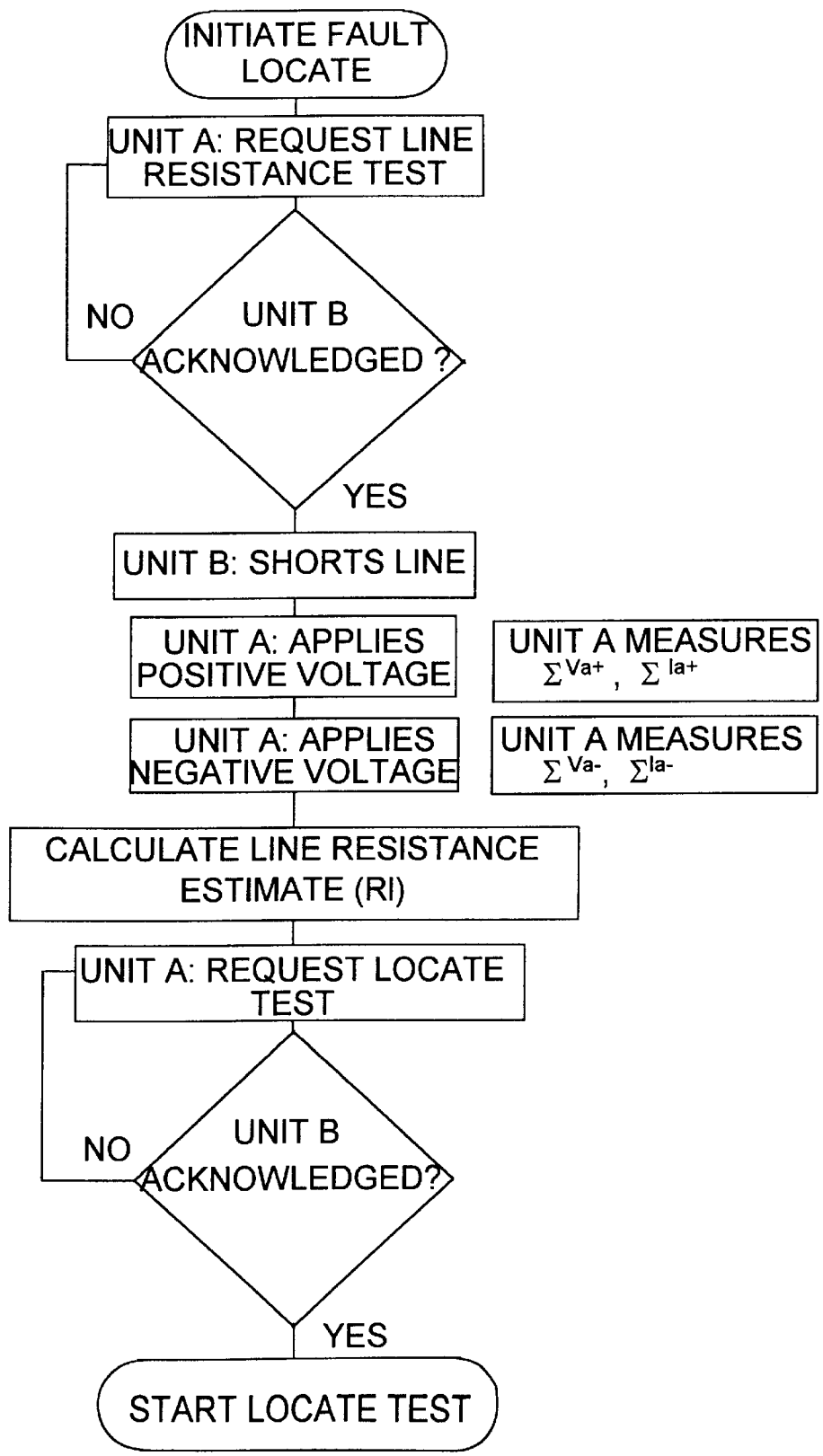
FIGS. 6a through 6d are a flow chart describing the operation of the apparatus.
Figure 6B:
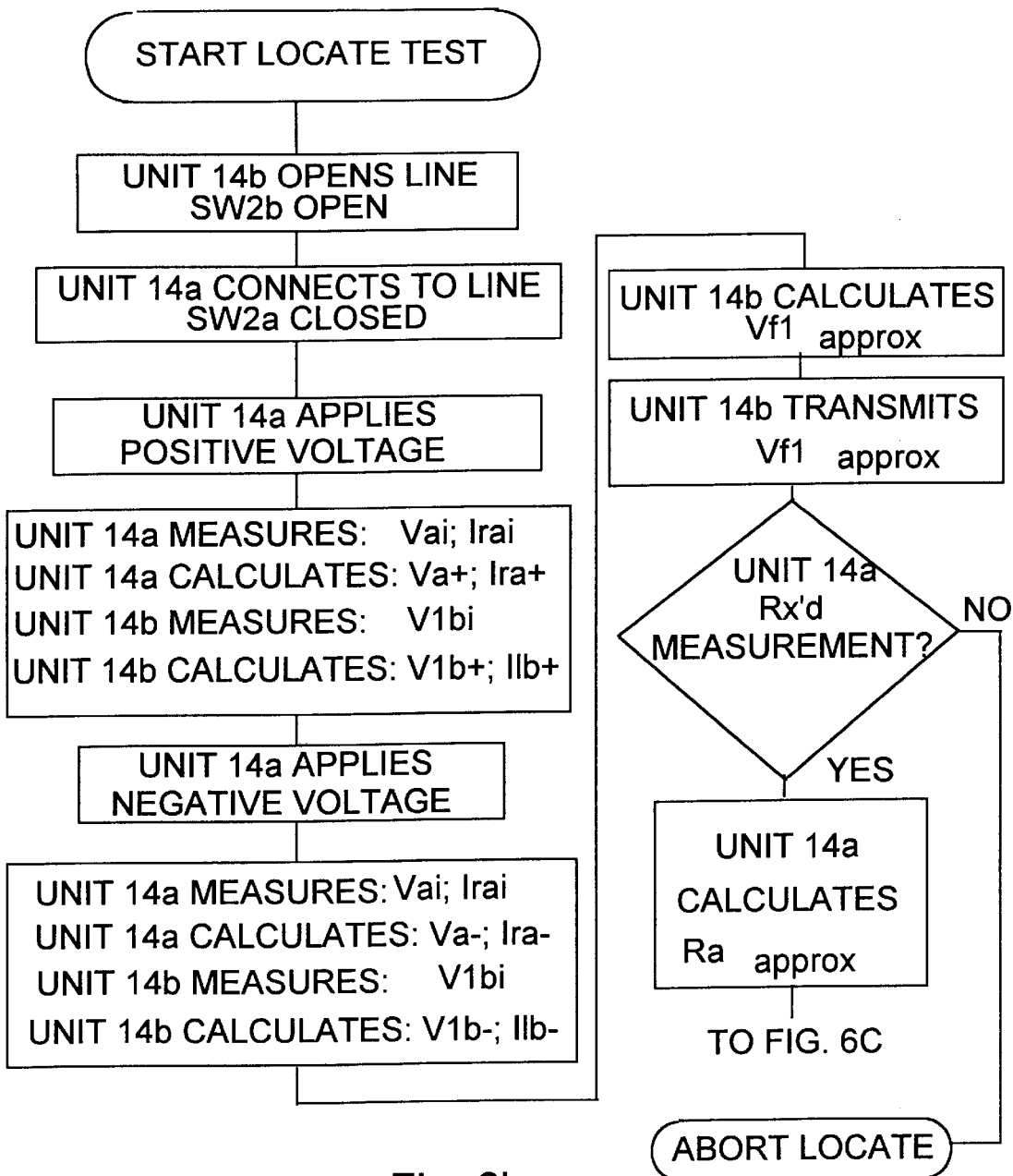
Figure 6C:
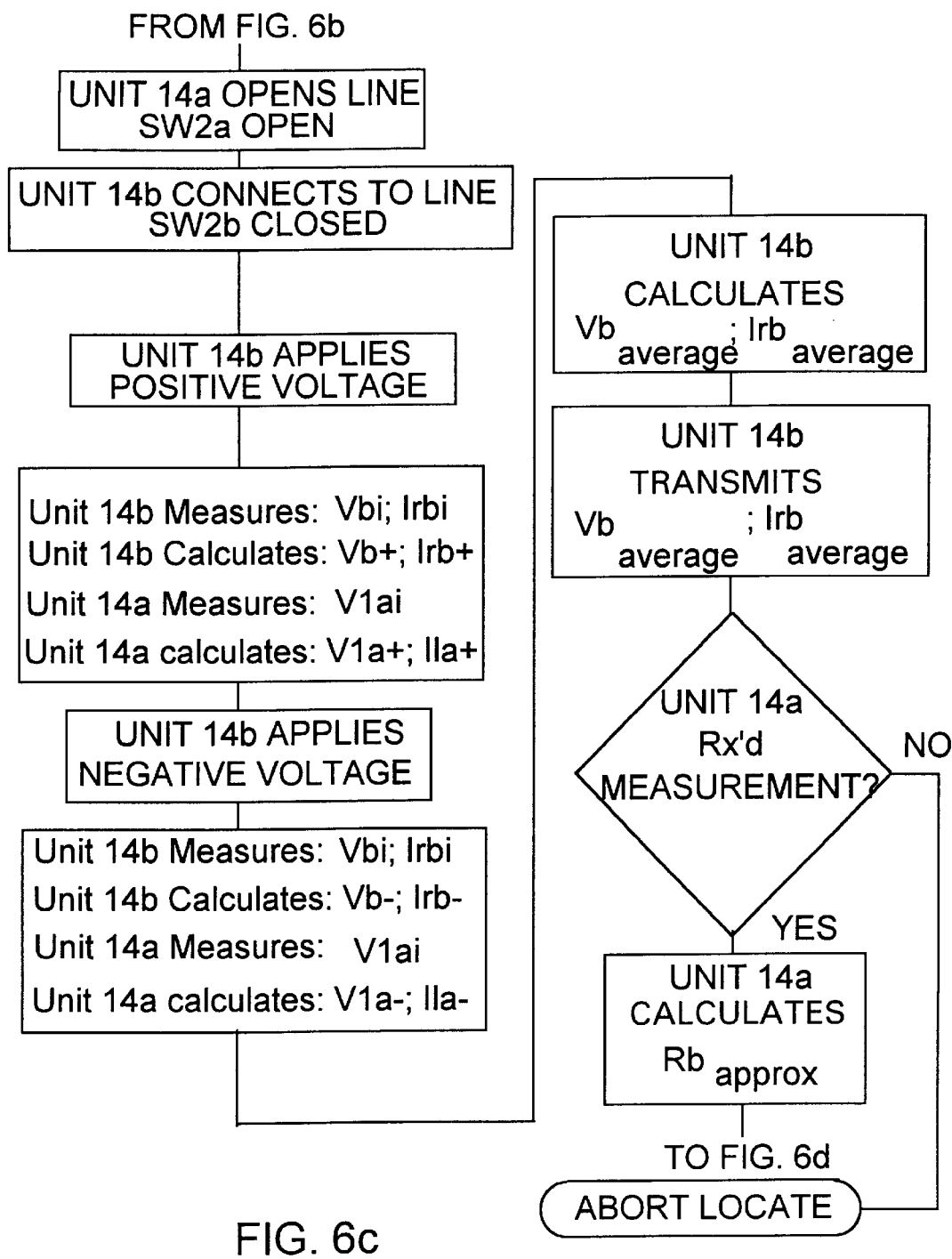
Figure 6D:
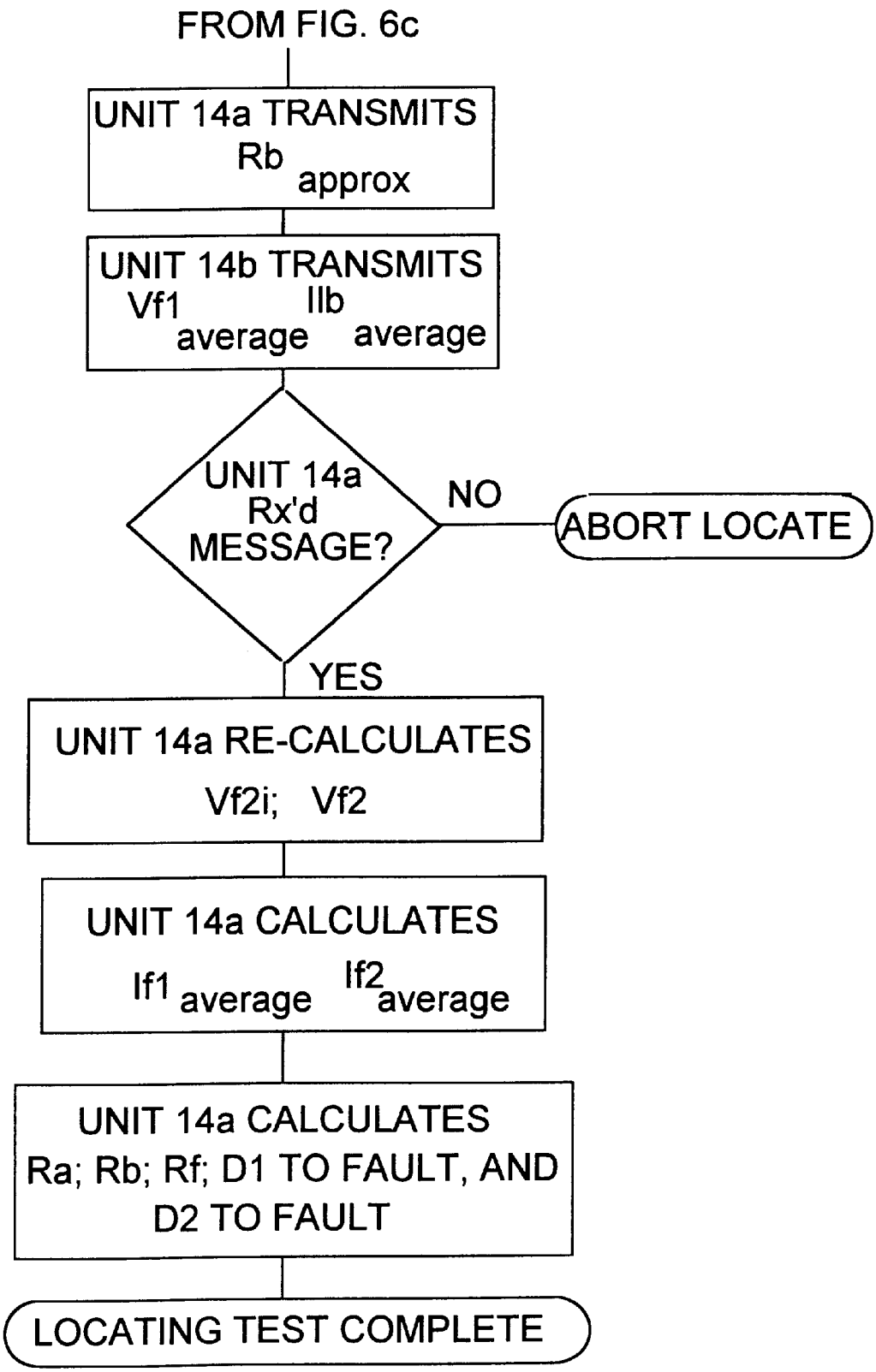

The flow chart FIGS. 6a, 6b and 6c describes the method used in fault location. Initially, the two instruments 14a and 14b are connected to the ends of the fault conductor. The two units establish communication over the faulted conductor. Instrument 14b then shorts the line with shunt switch 64. Instrument 14a applies a positive voltage to the conductor and a series of voltage and current readings are taken at end "a" of the conductor. The polarity is then reversed and another series of voltage and current readings are taken at end a. The voltage and current readings are summed and the total line resistance of the conductor is calculated.

After the line resistance test, instrument 14a communicates with instrument 14b and initiates a fault location test according to the procedure discussed above. At each occasion during the process when one of the instruments transmits a signal to the other, the information transmitted is not the raw data but a calculated value, thus minimizing the amount of information that must be transmitted over the faulted conductor.

While one particular embodiment of the present invention has been described in the foregoing, it is to be understood that other embodiments are possible within the scope of the invention and are intended to be included herein. The invention is to be considered limited solely by the scope of the appended claims.

We claim:

1. A method of locating a resistive fault between first and second ends of an electric conductor, said method comprising:
   (a) applying a DC voltage to the first end of the conductor;
   (b) taking a series of first voltage readings of the DC voltage at the first end of the conductor;
   (c) taking a series of first current readings at the first end of the conductor;
   (d) taking a series of second voltage readings of the DC voltage at the second end of the conductor;
   (e) recording the first voltage, first current and second voltage readings;
   (f) analyzing the series of first voltage and first current readings and discarding readings analyzed to have been effected by transients;
   (g) analyzing, independently of the analysis of the first voltage and first current readings, the series of second voltage readings and discarding readings analyzed to have been effected by transients;
   (h) computing from the undiscarded readings average values for the first voltage, first current and second voltage readings;
   (i) computing from the average values for the first voltage, first current and second voltage readings the resistance of the conductor between the resistive fault and the first end of the conductor; and
   (j) computing the distance between the resistive fault and the first end of the conductor from the computed resistance of the conductor.

2. A method according to claim 1 comprising the further steps of:
   (k) applying a DC voltage to the second end of the conductor;
   (l) taking a series of third voltage readings of the DC voltage at the second end of the conductor;
   (m) taking a series of second current readings at the second end of the conductor;
   (n) taking a series of fourth voltage readings of the DC voltage at the first end of the conductor;
   (o) recording the third voltage, second current and fourth voltage readings;
   (p) analyzing the series of third voltage and second current readings and discarding readings analyzed to have been effected by transients;
   (q) analyzing, independently of the analysis of the third voltage and second current readings, the series of fourth voltage readings and discarding readings analyzed to have been effected by transients;
   (r) computing from the undiscarded readings average values for the third voltage, second current and fourth voltage readings;
   (s) computing from the average values for the third voltage, second current and fourth voltage readings the resistance of the conductor between the resistive fault and the second end of the conductor; and
   (t) computing the distance between the resistive fault and the second end of the conductor from the computed resistance of the conductor.

3. A method according to claim 1 comprising performing steps (a) through (h) twice, with applied DC voltages of opposite polarity.

4. A method according to claim 2 comprising performing steps (a) through (h) twice, with applied DC voltages of opposite polarity, and performing steps (k) through (r) twice, with applied DC voltages of opposite polarity.

5. An apparatus for locating a resistive fault between first and second ends of an electric conductor, said apparatus comprising:
   a first power supply for applying a DC voltage to the first end of the conductor;
   first voltage metering means for taking a series of first voltage readings of the DC voltage at the first end of the conductor;
   first current metering means for taking a series of first current readings at the first end of the conductor;
   second voltage metering means for taking a series of second voltage readings of the DC voltage at the second end of the conductor;
   recording means for recording the first voltage, first current and second voltage readings;
   means for analyzing the first voltage and first current readings and discarding readings analyzed to have been effected by transients;

means, independent of the means for analyzing the first voltage and first current, for analyzing the second voltage readings and discarding readings analyzed to have been effected by transients;

means for computing from the undiscarded readings average values for the first voltage, first current and second voltage readings;

means for computing from the average values for the first voltage, first current and second voltage readings the resistance of the conductor between the resistive fault and at least one end of the conductor; and means for computing the distance between the resistive fault and at least one end of the conductor from the computed resistance of the conductor.

6. An apparatus according to claim 5 wherein the apparatus includes:

a second power supply for applying a DC voltage to the second end of the conductor;

switch means for selectively connecting and disconnecting the first and second power supplies to the conductor; and second current metering means for taking a series of second current readings at the second end of the conductor.

7. An apparatus according to claim 6 wherein each power supply includes polarity reversing switch means for applying DC voltages of opposite polarities to the ends of the conductor.

8. An apparatus according to claim 6 comprising first and second control units for connection to the first and second ends of the conductor, each control unit including:

a respective one of the voltage metering means;

a respective one of the current metering means;

recording means for recording the respective voltage and current readings;

means for analyzing the respective voltage and current readings and discarding readings analyzed to have been effected by transients;

means for computing from the undiscarded readings average values for the respective voltage and current readings;

means for transmitting computed average values to the other unit over the conductor; and means for receiving computed average values from the other unit.

* * * * *